(12) United States Patent
Tseng

(10) Patent No.: US 7,387,948 B2
(45) Date of Patent: Jun. 17, 2008

(54) STRUCTURE AND METHOD OF FORMING A SEMICONDUCTOR MATERIAL WAFER

(75) Inventor: Fan-Chi Tseng, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 498 days.

(21) Appl. No.: 11/196,338

(22) Filed: Aug. 4, 2005

(65) Prior Publication Data

US 2007/0032093 A1 Feb. 8, 2007

(51) Int. Cl.
*H01L 21/00* (2006.01)
*H01L 23/544* (2006.01)

(52) U.S. Cl. ............... 438/460; 257/620; 257/E21.599; 257/E23.126

(58) Field of Classification Search ............... 438/460, 438/465; 257/619, 620, E21.598, E21.599, 257/E23.126, E23.134
See application file for complete search history.

(56) References Cited

U.S. PATENT DOCUMENTS

| 6,649,485 B2 * | 11/2003 | Solanki et al. ............... 438/409 |
| 6,858,107 B2 * | 2/2005 | Ghyselen et al. ........... 156/250 |
| 6,958,094 B2 * | 10/2005 | Ohmi et al. .................. 117/92 |
| 7,025,665 B2 * | 4/2006 | Bender ........................ 451/296 |
| 7,125,608 B2 * | 10/2006 | Hong et al. ................. 428/446 |
| 7,126,263 B2 * | 10/2006 | Peck .................... 313/103 CM |
| 7,242,075 B2 * | 7/2007 | Mun et al. ................... 257/611 |
| 2005/0115489 A1 * | 6/2005 | Triboulet et al. .............. 117/2 |

* cited by examiner

*Primary Examiner*—David A Zarneke
(74) *Attorney, Agent, or Firm*—Rosenberg, Klein & Lee

(57) ABSTRACT

A structure and method of forming a semiconductor material wafer comprising forming an ingot of semiconductor material. A first dielectric layer is formed on the surface of the ingot, and the surface of the first dielectric layer is larger than the surface of the ingot. A second dielectric layer is formed on the surface of the first dielectric layer, and the surface of the second dielectric layer is larger than the surface of the first dielectric layer. The semiconductor wafer structure comprises a slip core formed of a semiconductor material, a first annular portion, and a second annular portion. The slip core had a first outer peripheral. The first annular portion is adjacent to the first outer peripheral, and is formed of a first dielectric material. The first annular portion has a second outer peripheral being larger than the first outer peripheral. The second annular portion is adjacent to the second outer peripheral, and is formed of a second dielectric material. The second annular portion has a third outer peripheral being larger than the second outer peripheral. The present invention provides the first annular portion and the second annular portion to protect the wafer, thereby preventing wafer edge cracks.

20 Claims, 5 Drawing Sheets

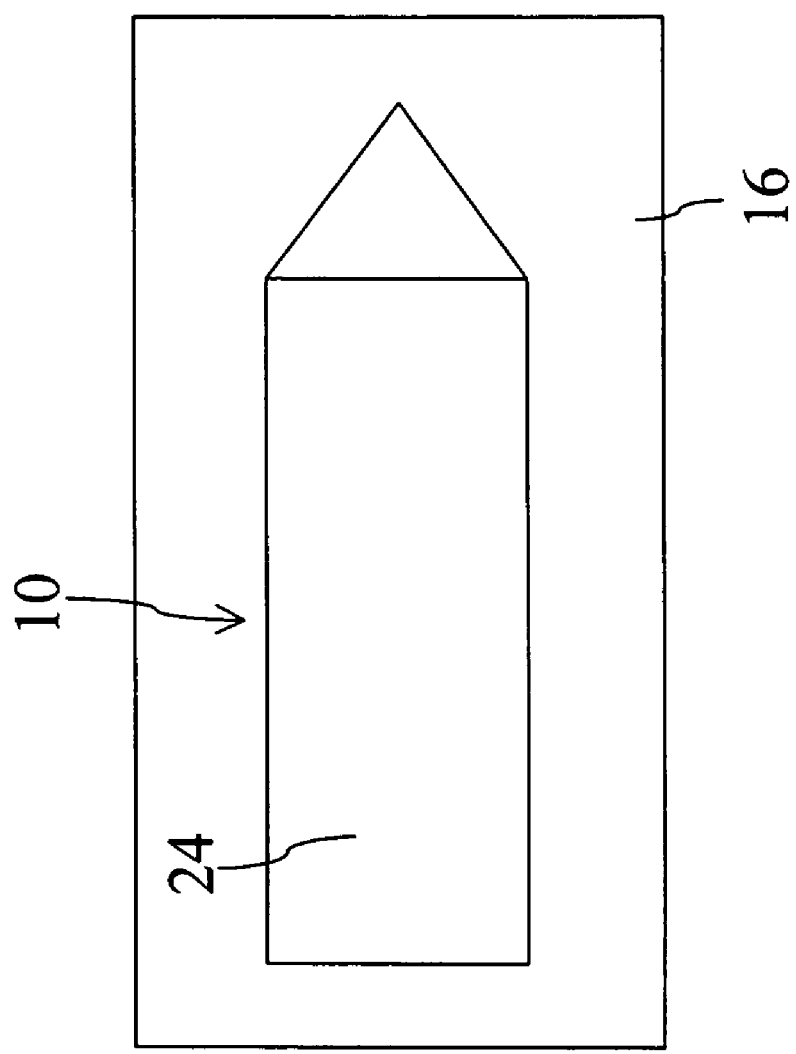

STRUCTURE AND METHOD OF FORMING A SEMICONDUCTOR MATERIAL WAFER

BACKGROUND OF THE INVENTION

1. Field of the Invention

The present invention relates to a structure and method of forming a semiconductor material wafer and, more particularly, to a structure and method of forming the wafer with sacrificial layers.

2. Description of the Prior Art

The Czochralski technique for growing single crystals is named CZ seed-pulling (1918). Silicon wafers are generally taken from crystals grown by Teal and Buehler. The CZ dislocation-free single crystal was developed by Dash.

The CZ method comprises the following steps: (1) poly charging; (2) meltdown; (3) necking and crown; (4) body growth; and (5) tail growth.

(1) poly charging and (2) meltdown—a new crucible is charged in the Graphite suspector, and the chuck polycrystalline silicon ("polysilicon") and dopant are charged to the crucible. In order to reduce the quartz crack caused by polysilicon and the suspector, the large diameter of chuck polysilicon is charged in the bottom and side of the suspector, and the dopant is charged in the central. The furnace is then closed, vacuumed, the leaking rate is checked, and heating is performed at a temperature higher than 1420° C. to completely melt and maintain for a time in order to uniformly mix the melted solution. If the chuck and granular material are used together, the granular material is slowly added from the side of the furnace before the chuck is completely melted, in order to achieve the desired total amount, and maintained for a time so as to evaporate the gas, in order to achieve the stable status of the solution temperature, the suspector temperature, and the thermal field.

(3) necking and crown through (5) tail growth—the temperature of the melted solution surface is fine-tuned by dipping the seed crystal into the solution, thereby monitoring the melting status. A monocrystalline seed with a specific shape and crystal orientation (1.7×1.7×2.5 cm) is dipped into the solution about 0.3 cm. If this dipped seed crystal is easily melted, the output power of the heater needs to be reduced. If the dendritic polysilicon is grown outwardly from the dipped seed crystal, the output power needs to be increased. Under proper temperature, the seed crystal is rotated and pulled. The dipped seed crystal is pulled to form a new monocrystalline seed with a diameter of 0.5~0.7 cm. It is so-called "the neck". The growth rate of the neck diameter and the internal quality are controlled by skilled operators. The purpose of growing the necking is to eliminate plastic deformation defects 5 caused by machining, for example, dislocation and vacancy, or defects caused by rapidly heating the seed crystal contacted with the solution.

The grown ingot is sawed into a plurality of slip wafers, thereby forming the required structures on the wafers. Since each wafer is not easy to form, cracks are inspected by instrumentation when the wafer edge or even the main body generates a crack caused by the external factors during the subsequence processing. This usually wastes resources and increases costs.

SUMMARY OF THE INVENTION

In view of this, in order to prevent wafer edge cracks during processing, the present invention provides a structure and method of forming a semiconductor material wafer, which comprises forming sacrificial layers and the structure while forming the wafer ingot, thereby preventing wafer edge cracks.

The present invention also provides a structure and method of forming a wafer with a dielectric layer and sacrificial layer, which are applied in the wafers with various sizes.

These objects are accomplished by providing a method of forming a semiconductor material wafer. An ingot of semiconductor material is formed, and has a first surface. A first dielectric layer is then formed on the first surface, and has a second surface. The second surface is larger than the first surface. A second dielectric layer is formed on the second surface, and has a third surface. The third surface is larger than the second surface.

Another embodiment of the present invention provides a semiconductor wafer structure comprising a slip core formed of a semiconductor material. The slip core has a first outer peripheral, a first annular portion, and a second annular portion. The first annular portion is adjacent to the first outer peripheral, and is formed of a first dielectric material. The first annular portion has a second outer peripheral being larger than the first outer peripheral. The second annular portion is adjacent to the second outer peripheral, and is formed of a second dielectric material. The second annular portion has a third outer peripheral being larger than the second outer peripheral.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 1C is a top view of placing the ingot in a chamber to form a second dielectric layer according to an embodiment of the present invention;

DETAILED DESCRIPTION OF THE PREFERRED EMBODIMENTS

The present invention provides a structure and method of forming a semiconductor material wafer, which comprises forming sacrificial layers and the structure while forming the wafer ingot, in order to consolidate the wafer, thereby preventing wafer edge cracks. The structure and the method of the present invention can be applied in various sizes of wafers.

Figure 1A:
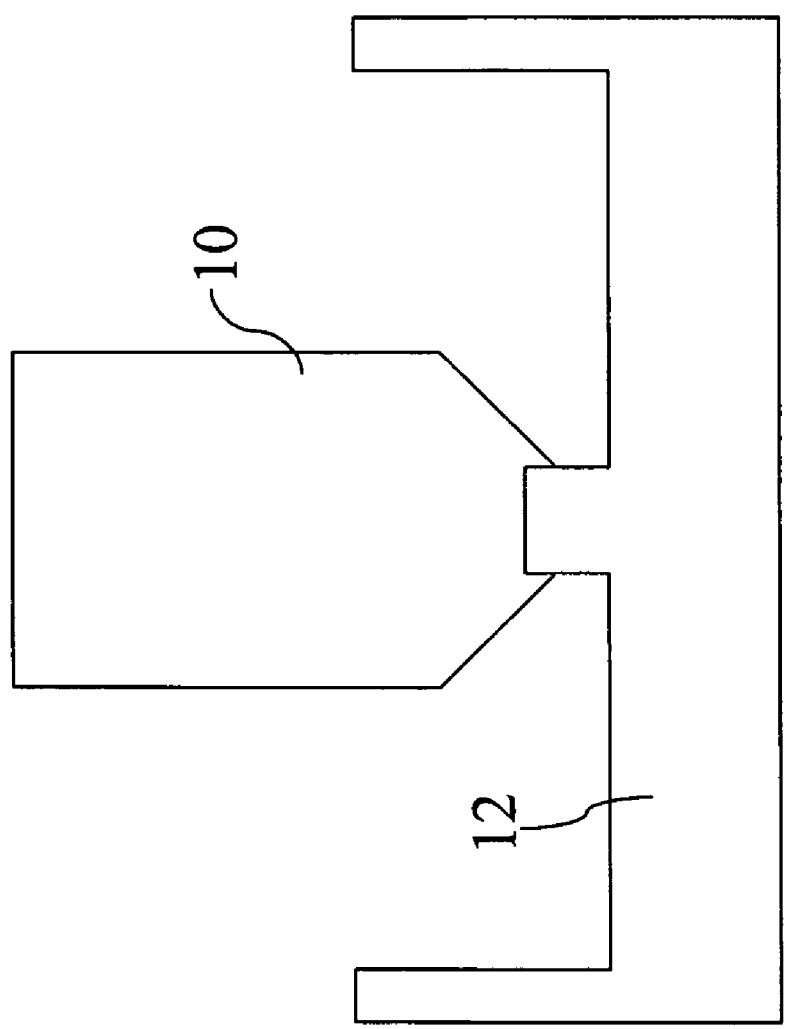
FIG. 1A is a section view illustrative of growing a semiconductor ingot according to an embodiment of the present invention.

Refer to FIG. 1A, which is a section view illustrative of growing a semiconductor ingot according to an embodiment of the present invention. An ingot 10 formed of semiconductor material is clipped in an ingot support device 12. This ingot 10 is formed by a suitable method, such as the Czochralski (CZ) method. The semiconductor material of the ingot 10 can be, but not limited to, silicon or gallium arsenide (AsGa), which are used as the semiconductor material of wafer. In this embodiment, the growth ingot 10 comprises 4 inch through 12 inch wafers. Wafers which are larger than 12 inches, may be made without departing from the scope of the present invention.

Figure 1B:
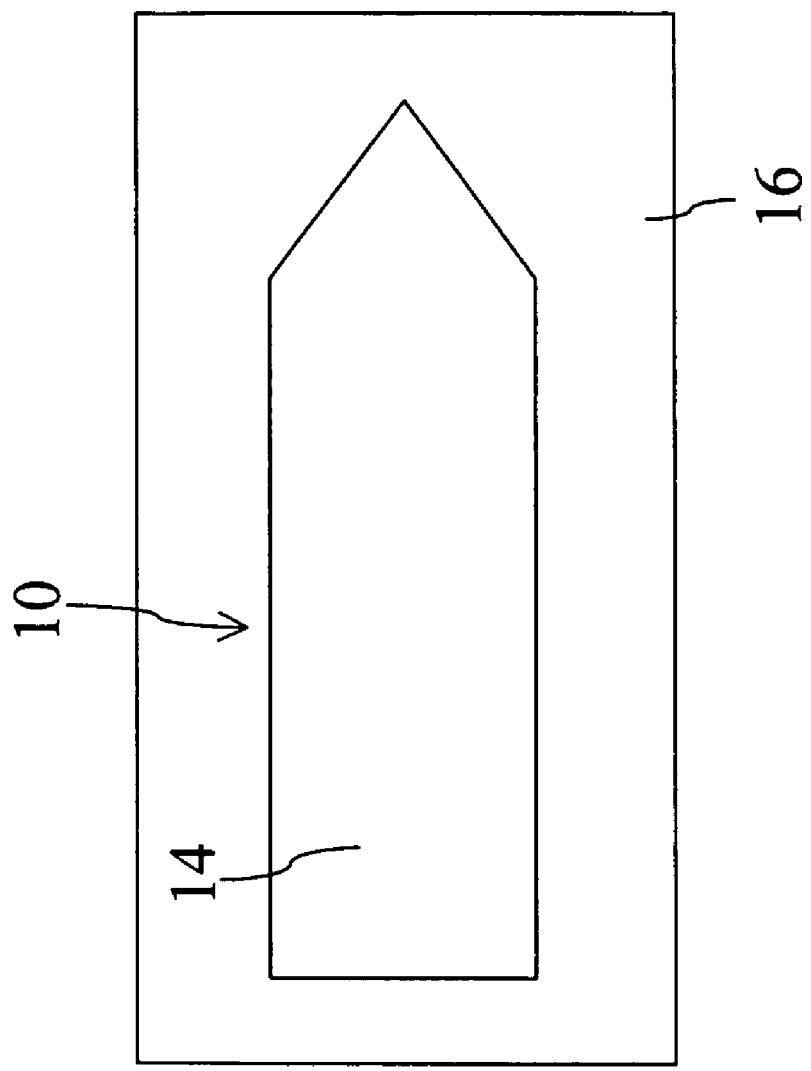
FIG. 1B is a top view of placing the ingot in a chamber to form a first dielectric layer according to an embodiment of the present invention.
Figure 2:
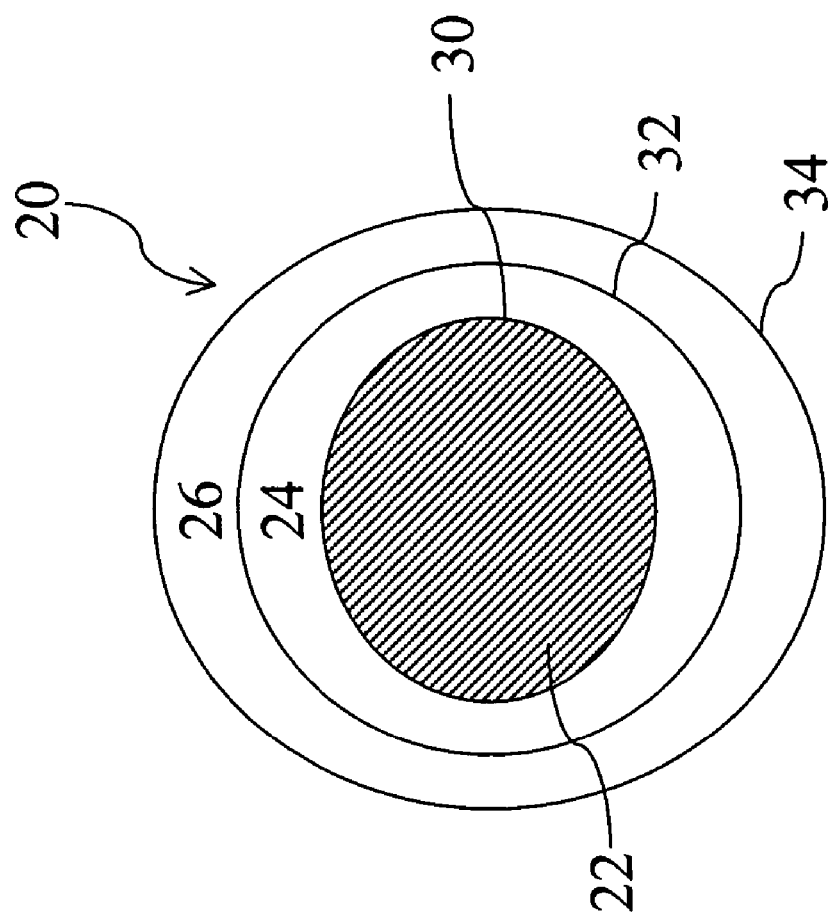
FIG. 2 is a top view of forming a wafer structure according to an embodiment of the present invention.

FIG. 1B is a top view of placing the ingot in a chamber to form a first dielectric layer according to the present invention. As shown in FIG. 1B, the growth ingot 10 has a pillar surface 14. This pillar surface 14 forms an outer peripheral. The ingot 10 is placed in a chamber 16 after performing a polishing treatment, thereby forming a first dielectric layer 24, as shown in FIG. 2. The ingot 10 is heated in the chamber 16 to form an oxide layer on the surface 14, for example, a silicon oxide layer, and the thickness is determined depending on the requirement.

Refer to FIG. 1C, which is a top view of a second dielectric layer when placing the ingot in a chamber. The ingot 10 covered by the oxide layer is placed in the same chamber 16 or another chamber to form a second dielectric layer 26 on the surface of the first dielectric layer 24, as shown in FIG, 2. In the preferred embodiment, a nitride layer is deposited on the surface of the oxide layer by a Chemical or Physical Vapor deposition, for example, silicon nitride, and the thickness is determined depending on the requirement.

Figure 1D:
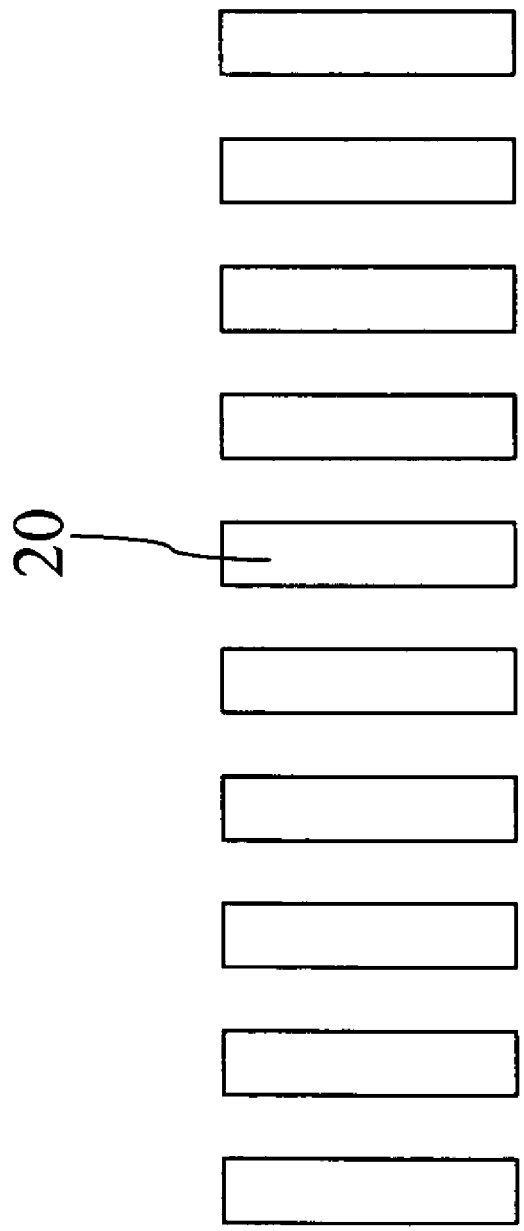
FIG. 1D is a section view illustrative of sawing the pillar ingot having the first and second dielectric layers into the wafers according to an embodiment of the present invention.

Refer to FIG. 1D, which is a section view illustrative of sawing the pillar ingot having the first and second dielectric layers into wafers. By using conventional technology, the pillar ingot 10 is sawed into a plurality of slip wafers, and the thickness is determined depending on the requirement.

FIG. 2 is a top view of forming a wafer structure according to the present invention. As shown in FIG. 2, the wafer 20 has a slip core 22, a first annular dielectric layer 24, and a second annular dielectric layer 26. The slip core 22 is formed from the sawed pillar ingot. The peripheral of the slip core 22 has an outer peripheral 30. The outer peripheral of the slip core 22 is adjacent with the first annular dielectric layer 24. The first annular dielectric layer 24 has an inner edge and an outer peripheral. The inner edge is adjacently connected with the outer peripheral 30 of the slip core 22. Therefore, the inner edge of the first annular dielectric layer 24 is substantially equal to the outer peripheral 30. Since the first dielectric layer 24 is covered on the pillar ingot 10 with a thickness, in which the surface of the first dielectric layer 24 is larger than the surface of the ingot 10 as shown in FIG. 1C, the outer peripheral 32 of the first annular dielectric layer 24 is larger than the outer peripheral 30 of the slip core 22. The second annular dielectric layer 26 has an inner edge and an outer peripheral. The inner edge is adjacently connected with the outer peripheral 32 of the first annular dielectric layer 24. The outer peripheral 34 of the second annular dielectric layer 26 is larger than the outer peripheral 32 of the first annular dielectric layer 24.

The outer peripheral of the slip core 22 is protected by the first annular dielectric layer 24 and the second annular dielectric layer 26 to clip the chuck during the processing, thereby preventing wafer edge cracks caused by the external force when the chuck is too close to the slip core 22. Therefore, the first annular dielectric layer 24 and the second annular dielectric layer 26 are used as sacrificial layers in order to protect the wafer, thereby reducing the damage rate of the wafer during the processing.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A method of forming a semiconductor material wafer, comprising:
    forming an ingot of semiconductor material having a first surface thereon;
    forming a first dielectric layer on the first surface, the first dielectric layer having a second surface thereon, wherein the second surface is larger than the first surface; and
    forming a second dielectric layer on the second surface, the second dielectric layer having a third surface, wherein the third surface is larger than the second surface.

2. The method of forming a semiconductor material wafer of claim 1, further comprising polishing the first surface.

3. The method of forming a semiconductor material wafer of claim 1, further comprising sawing the ingot, the first dielectric layer, and the second dielectric layer into a plurality of slip wafers.

4. The method of forming a semiconductor material wafer of claim 3, wherein each slip wafer comprises the first surface, the second surface and the third surface.

5. The method of forming a semiconductor material wafer of claim 1, wherein forming the first dielectric layer comprises heating the ingot to form an oxide layer.

6. The method of forming a semiconductor material wafer of claim 1, wherein forming the second dielectric layer comprises forming an oxide layer.

7. The method of forming a semiconductor material wafer of claim 6, wherein forming the oxide layer is performed by Chemical Vapor Deposition.

8. The method of forming a semiconductor material wafer of claim 6, wherein forming the oxide layer is performed by Physical Vapor Deposition.

9. A method of forming a semiconductor material wafer, comprising:
    forming a pillar ingot;
    heating the pillar ingot to form a first dielectric layer on the pillar ingot;
    depositing a second dielectric layer on the first dielectric layer; and
    sawing the pillar ingot, the first dielectric layer and the second dielectric layer to form a plurality of slip wafers, wherein each slip wafer comprises the pillar ingot, the first dielectric layer, and the second dielectric layer.

10. The method of forming a semiconductor material wafer of claim 9, further comprising polishing the pillar ingot.

11. The method of forming a semiconductor material wafer of claim 9, wherein forming the first dielectric layer comprises forming an oxide layer.

12. The method of forming a semiconductor material wafer of claim 9, wherein forming the second dielectric layer comprises forming a nitride layer.

13. A semiconductor wafer structure, comprising:
 a slip core formed of a semiconductor material, wherein the slip core has a first outer peripheral;
 a first annular portion adjacent to the first outer peripheral, the first annular comprising a first dielectric material, wherein the first annular portion has a second outer peripheral larger than the first outer peripheral; and
 a second annular portion adjacent to the second outer peripheral, the second annular comprised of a second dielectric material, wherein the second annular portion has a third outer peripheral larger than the second outer peripheral.

14. The semiconductor wafer structure of claim 13, wherein the semiconductor material is silicon material.

15. The semiconductor wafer structure of claim 13, wherein the semiconductor material is gallium arsenide (AsGa).

16. The semiconductor wafer structure of claim 13, wherein the first dielectric material is silicon oxide.

17. The semiconductor wafer structure of claim 13, wherein the second dielectric material is silicon nitride.

18. The semiconductor wafer structure of claim 13, wherein the first annular portion has a first inner peripheral adjacent to the first outer peripheral, wherein the first inner peripheral is substantially equal to the adjacent outer peripheral.

19. The semiconductor wafer structure of claim 18, wherein the second annular portion has a second inner peripheral adjacent to the second outer peripheral, wherein the second inner peripheral is substantially equal to the adjacent second outer peripheral.

20. A semiconductor wafer structure, comprising:
 a pillar ingot formed of a semiconductor material, wherein the pillar ingot has a first surface;
 an oxide layer covered on the first surface, the oxide layer having a second surface thereon, wherein the second surface is larger than the first surface; and
 a nitride layer covered on the second surface, the nitride layer having a third surface, wherein the third surface is larger than the second surface.

* * * * *